United States Patent
Eschbach et al.

(10) Patent No.: US 9,760,659 B2
(45) Date of Patent: Sep. 12, 2017

(54) PACKAGE DEFINITION SYSTEM WITH NON-SYMMETRIC FUNCTIONAL ELEMENTS AS A FUNCTION OF PACKAGE EDGE PROPERTY

(71) Applicant: Xerox Corporation, Norwalk, CT (US)

(72) Inventors: Reiner Eschbach, Webster, NY (US); Stephen C. Morgana, Rochester, NY (US)

(73) Assignee: Xerox Corporation, Norwalk, CT (US)

( * ) Notice: Subject to any disclaimer, the term of this patent is extended or adjusted under 35 U.S.C. 154(b) by 767 days.

(21) Appl. No.: 14/168,514

(22) Filed: Jan. 30, 2014

(65) Prior Publication Data
US 2015/0213155 A1    Jul. 30, 2015

(51) Int. Cl.
*G06F 17/50* (2006.01)
*B31B 49/02* (2006.01)

(52) U.S. Cl.
CPC .............. *G06F 17/50* (2013.01); *B31B 49/02* (2013.01); *B31B 2201/6095* (2013.01); *B31B 2203/066* (2013.01); *B31B 2203/086* (2013.01)

(58) Field of Classification Search
CPC ... G06F 17/50; B31B 49/02; B31B 2203/066; B31B 2203/086; B31B 2201/6095
USPC ............ 493/22, 23, 25, 56, 61, 86; 345/440, 345/441, 419, 619
See application file for complete search history.

(56) References Cited

U.S. PATENT DOCUMENTS

| | | |
|---|---|---|
| 3,902,655 A | 9/1975 | Huffman |
| 5,235,519 A | 8/1993 | Miura |
| 5,291,583 A | 3/1994 | Bapat |
| 5,353,390 A | 10/1994 | Harrington |
| 5,457,904 A | 10/1995 | Colvin |

(Continued)

FOREIGN PATENT DOCUMENTS

| | | |
|---|---|---|
| EP | 621113 A1 | 10/1994 |
| WO | WO-2005000681 A2 | 1/2005 |

(Continued)

OTHER PUBLICATIONS

Lu et al., "Folding Cartons with Fixtures: A Motion Planning Approach", IEEE Transactions on Robotics and Automation, vol. 16, No. 4, Aug. 2000, pp. 346-356.

(Continued)

*Primary Examiner* — Hemant M Desai
*Assistant Examiner* — Mobeen Ahmed
(74) *Attorney, Agent, or Firm* — Fox Rothschild LLP

(57) ABSTRACT

A package generation system creates a package definition file for creation of a package flat. The file includes dimensions for cut lines along which the package will be separated from a two dimensional substrate. The flat includes facets and functional elements that connect the facets. The system will identify a pair of the functional elements that have a connecting relationship. The first facet of the pair is a tab structure having a symmetric design, and the second facet of the pair is a receiving structure. If the tab structure and receiving structure are connected to cut lines that intersect at a pivot point, the system will convert the definition of the tab structure from the symmetric design to a non-symmetric design. It will save dimensions for the edges and functional elements in the package design file with the non-symmetric design.

16 Claims, 12 Drawing Sheets

(56) References Cited

U.S. PATENT DOCUMENTS

| | | |
|---|---|---|
| 5,513,117 A | 4/1996 | Small |
| 5,518,574 A | 5/1996 | Yates et al. |
| 5,528,517 A | 6/1996 | Loken |
| 5,687,087 A | 11/1997 | Taggart |
| 5,768,142 A | 6/1998 | Jacobs |
| 5,805,784 A | 9/1998 | Crawford |
| 5,838,574 A | 11/1998 | Olson et al. |
| 5,881,538 A | 3/1999 | Blohm |
| 5,923,556 A | 7/1999 | Harris |
| 6,005,959 A | 12/1999 | Mohan et al. |
| 6,090,027 A | 7/2000 | Brinkman |
| 6,092,054 A | 7/2000 | Tackbary et al. |
| 6,117,061 A | 9/2000 | Popat et al. |
| 6,134,018 A | 10/2000 | Dziesietnik et al. |
| 6,153,039 A | 11/2000 | Jacobsen |
| 6,237,787 B1 | 5/2001 | Gallo et al. |
| 6,243,172 B1 | 6/2001 | Gauthier et al. |
| 6,246,468 B1 | 6/2001 | Dimsdale |
| 6,332,149 B1 | 12/2001 | Warmus et al. |
| 6,409,019 B1 | 6/2002 | Hornsby et al. |
| 6,687,016 B2 | 2/2004 | Gauthier |
| 6,689,035 B1 | 2/2004 | Gerber |
| 6,771,387 B2 | 8/2004 | Gauthier |
| 6,895,549 B1 | 5/2005 | Albright et al. |
| 6,896,250 B2 | 5/2005 | Hillebrand |
| 6,939,063 B2 | 9/2005 | Bussell |
| 6,945,645 B2 | 9/2005 | Baron |
| 6,948,115 B2 | 9/2005 | Aizikowitz et al. |
| 6,953,513 B1 | 10/2005 | Volkert |
| 7,013,616 B1 | 3/2006 | Powers et al. |
| 7,174,720 B2 | 2/2007 | Kennedy |
| 7,191,392 B1 | 3/2007 | Coar |
| 7,197,465 B1 | 3/2007 | Hu et al. |
| 7,243,303 B2 | 7/2007 | Purvis et al. |
| 7,293,652 B2 * | 11/2007 | Learn ............... B65D 5/0218 206/497 |
| 7,327,362 B2 | 2/2008 | Grau |
| 7,366,643 B2 | 4/2008 | Verdura et al. |
| 7,367,027 B1 | 4/2008 | Chen et al. |
| 7,406,194 B2 | 7/2008 | Aizikowitz et al. |
| 7,413,175 B2 | 8/2008 | Levine et al. |
| 7,446,404 B2 | 11/2008 | Huang et al. |
| 7,647,752 B2 | 1/2010 | Magnell |
| 7,832,560 B2 | 11/2010 | Tilton |
| 7,941,465 B2 | 5/2011 | Gombert et al. |
| 8,160,992 B2 | 4/2012 | Gombert et al. |
| 8,170,706 B2 | 5/2012 | Gombert et al. |
| 8,170,709 B2 | 5/2012 | Puissant |
| 8,195,227 B1 | 6/2012 | Bushman et al. |
| 8,869,083 B1 * | 10/2014 | Morgana ............... G06F 17/50 716/110 |
| 8,915,831 B2 * | 12/2014 | Walker ................ B31B 1/78 493/1 |
| 2002/0085001 A1 | 7/2002 | Taylor |
| 2002/0091592 A1 | 7/2002 | Sugiura et al. |
| 2002/0104293 A1 | 8/2002 | Armington et al. |
| 2002/0118874 A1 | 8/2002 | Chung et al. |
| 2003/0035138 A1 | 2/2003 | Schilling |
| 2003/0083763 A1 | 5/2003 | Kiyohara et al. |
| 2003/0091227 A1 | 5/2003 | Chang et al. |
| 2003/0164875 A1 | 9/2003 | Myers |
| 2003/0200111 A1 | 10/2003 | Damji |
| 2004/0073407 A1 | 4/2004 | Nguyen et al. |
| 2004/0120603 A1 | 6/2004 | Gupta |
| 2004/0218799 A1 | 11/2004 | Mastie et al. |
| 2005/0005261 A1 | 1/2005 | Severin |
| 2005/0012949 A1 | 1/2005 | Kitahara et al. |
| 2005/0050052 A1 | 3/2005 | Zimmerman et al. |
| 2005/0132356 A1 | 6/2005 | Cross et al. |
| 2005/0249400 A1 | 11/2005 | Fukumoto |
| 2006/0080274 A1 | 4/2006 | Mourad |
| 2006/0155561 A1 | 7/2006 | Harper |
| 2006/0217831 A1 | 9/2006 | Butterworth et al. |
| 2006/0284360 A1 | 12/2006 | Hume et al. |
| 2007/0041035 A1 | 2/2007 | Sembower et al. |
| 2007/0042885 A1 | 2/2007 | Rietjens et al. |
| 2007/0112460 A1 | 5/2007 | Kiselik |
| 2008/0020916 A1 | 1/2008 | Magnell |
| 2008/0048308 A1 | 2/2008 | Lam |
| 2008/0128478 A1 * | 6/2008 | Quadrelli ............... B65D 5/029 229/110 |
| 2008/0255945 A1 | 10/2008 | Percival et al. |
| 2008/0273945 A1 | 11/2008 | Levine et al. |
| 2009/0063381 A1 | 3/2009 | Chan et al. |
| 2009/0070213 A1 | 3/2009 | Miller et al. |
| 2009/0212096 A1 * | 8/2009 | Sieber ................. B65D 5/6608 229/116.1 |
| 2009/0236752 A1 | 9/2009 | Lee et al. |
| 2009/0278843 A1 * | 11/2009 | Evans ..................... G06F 17/50 345/419 |
| 2009/0282782 A1 | 11/2009 | Walker et al. |
| 2009/0287632 A1 | 11/2009 | Gombert et al. |
| 2010/0060909 A1 | 3/2010 | Conescu et al. |
| 2010/0098319 A1 | 4/2010 | Gombert et al. |
| 2010/0110479 A1 | 5/2010 | Gombert et al. |
| 2010/0214622 A1 | 8/2010 | Ruegg et al. |
| 2012/0193404 A1 * | 8/2012 | Eckermann ............ B65D 71/36 229/117.14 |
| 2013/0120767 A1 | 5/2013 | Mandel et al. |
| 2013/0120770 A1 | 5/2013 | Mandel et al. |
| 2014/0038801 A1 * | 2/2014 | Morgana ............... B65D 5/0227 493/1 |
| 2014/0038802 A1 | 2/2014 | Clark et al. |
| 2014/0040319 A1 | 2/2014 | Morgana et al. |
| 2014/0121800 A1 | 5/2014 | Morgana et al. |
| 2014/0129018 A1 | 5/2014 | Morgana et al. |
| 2014/0139849 A1 * | 5/2014 | Eschbach ................. B31B 1/00 358/1.6 |
| 2014/0305826 A1 * | 10/2014 | Holley, Jr. ............... B65D 5/50 206/433 |
| 2015/0114874 A1 * | 4/2015 | Spivey, Sr. ............. B65D 71/18 206/565 |
| 2015/0158648 A1 * | 6/2015 | Holley, Jr. ............... B65D 5/32 206/433 |

FOREIGN PATENT DOCUMENTS

| | | |
|---|---|---|
| WO | WO-2005054983 A2 | 6/2005 |
| WO | WO-2005122079 A2 | 12/2005 |
| WO | WO-2006108269 A1 | 10/2006 |
| WO | WO-2007021920 A2 | 2/2007 |

OTHER PUBLICATIONS http/www.esko.com/tmp/080606115325/G2558322_Kongsberg_tables_us_pdf.

* cited by examiner

PACKAGE DEFINITION SYSTEM WITH NON-SYMMETRIC FUNCTIONAL ELEMENTS AS A FUNCTION OF PACKAGE EDGE PROPERTY

RELATED APPLICATIONS

This patent application is related to U.S. patent application Ser. Nos. 13/563,071 and 13/563,288, each entitled "Package Definition System," the disclosures of which are fully incorporated herein by reference.

BACKGROUND

There has been significant interest in the manufacture of personalized packaging for small volume applications. Methods and systems for creating personalized packaging are described in previous patent filings such as U.S. patent application Ser. No. 13/563,071, titled "Package Definition System," and U.S. patent application Ser. No. 13/904,377, titled "Dynamic Bridge Generation in Package Definition Systems." These systems allow an end user to create a package or similar three-dimensional structure by defining dimensions and providing some information about functionality.

As users desire additional options and increased customization, there is a need for continued improvement of automated package customization systems.

SUMMARY

In an embodiment, a system that includes a processor implements programming instructions that cause it to create a package design file for a two-dimensional representation of a three-dimensional structure having a plurality of facets. The system creates the file by defining a set of cut lines, where each cut line represents a line along which the three-dimensional structure will be separated from a two dimensional substrate. The system identifies a number of facets that are functional elements of the structure. The system also identifies a functional element that has a connecting relationship with a receiving structure, where the functional element comprises a tab structure having a symmetric design. If the system determines that the tab structure and receiving structure are each connected to cut lines that intersect each other at a pivot point, it will convert a definition of the tab structure from the symmetric design to a non-symmetric design. The system will save dimensions for the defined cut lines and the pair of functional elements to the package design file so that the definition of the tab structure includes the non-symmetric design.

In some embodiments, when the system converts the definition of the tab structure to the non-symmetric design, it may use a location of the pivot point to define at least a portion of the tab structure using polar coordinates with respect to the pivot point. If so, then when defining at least a portion of the tab structure using polar coordinates with respect to the pivot point, the system may replace at least one straight edge of the tab structure with a curved edge, the coordinates of which exhibit a constant distance from the pivot point. Alternatively, when defining at least a portion of the tab structure using polar coordinates with respect to the pivot point, the system may replace at least one straight edge of the tab structure with a curved edge while maintaining a constant distance between a distal edge of the tab structure and the edge of the facet to which the tab structure is connected. As another alternative, when defining at least a portion of the tab structure using polar coordinates with respect to the pivot point, the system may define a set of critical points of the tab structure replace at least one straight edge of the tab structure with a curved edge, while maintaining a constant distance between each critical point and the edge of the facet to which the tab structure is connected.

If the tab structure includes more than one tab, then when defining at least a portion of the tab structure using polar coordinates with respect to the pivot point, the system may identify a first tab element of the tab structure that is positioned along an edge of the facet to which the tab structure is connected, the first tab element being positioned at a first distance from the pivot point. The system may also identify a second tab element of the tab structure that is positioned along the edge at a second distance from the pivot point. In this situation, the first tab element and the second tab element may have identical dimensions in the symmetric design, and the first distance may be greater than the second distance. The system will define a critical point on each of the first tab element and the second tab element, and it will replace at least one straight edge of each of the first tab element and the second tab element with a curved edge, while maintaining a constant distance between each critical point and the edge of the facet to which the tab structure is connected.

In some embodiments, identifying the pair the functional elements that have a connecting relationship may include identifying a set of locking tabs as the tab structure and identifying a set of receiving slots as the receiving structure. In other embodiments, identifying the pair the functional elements that have a connecting relationship may include identifying at least one sliding tab as the tab structure and identifying an interior of a facet as the receiving structure.

In another embodiment, a package generation portion of the system may access the package design file to apply a set of rules that apply the cut lines to the substrate.

DETAILED DESCRIPTION

This disclosure is not limited to the particular systems, devices and methods described, as these may vary. The terminology used in the description is for the purpose of describing the particular versions or embodiments only, and is not intended to limit the scope.

As used in this document, the singular forms of any word, and defining adjectives such as "a," "an" and "the," each include plural references unless the context clearly dictates otherwise. Unless defined otherwise, all technical and scientific terms used herein have the same meanings as commonly understood by one of ordinary skill in the art. As used in this document, the term "comprising" means "including, but not limited to."

A "package generation system" is a machine or group of machines that combines the features of a print device with one or more tools for imparting a cut, crease, and/or perforation on a printed substrate so that the substrate may be folded into a three-dimensional package, or other folds or structures.

A "package flat" refers to a generally two-dimensional structure having two or more facets formed in a substrate by cut lines (including perforations) and/or fold lines (including creases and/or score lines). The package flat also may include printed content on one or more of the facets. The flat may be removed from the substrate at the cut lines, and the flat may then be folded into a three-dimensional structure having two or more sides.

Package production may be performed by a package generation system that is capable of performing printing operations on, and applying creases and cuts to, a substrate. The system also may perform other actions such as coating and/or stacking the substrate. Examples of automated package generation systems include those in the iGen® series of digital production printing presses, available from Xerox Corporation, in connection with corresponding finishing devices. Other systems may include smaller printing devices, such as a Xerox DocuColor® 250, or a digital cutter as offered by a variety of manufacturers.

One aspect in the creation of a package is that the printing device operates on a two dimensional sheet—i.e., a package flat. The actual three-dimensional shape of the package is subsequently created by folding and connecting the facets that make up the flat. Here it is understood that various types of folds may create a three-dimensional structure or shape in the language of this application. This imposes a variety of restrictions on the structure both in its two dimensional form, as well as in its three dimensional form. The substrate is typically a paper material, such as cardstock, cardboard, or paper having sufficient thickness to provide structural support when folded into a three-dimensional shape.

Figure 1:
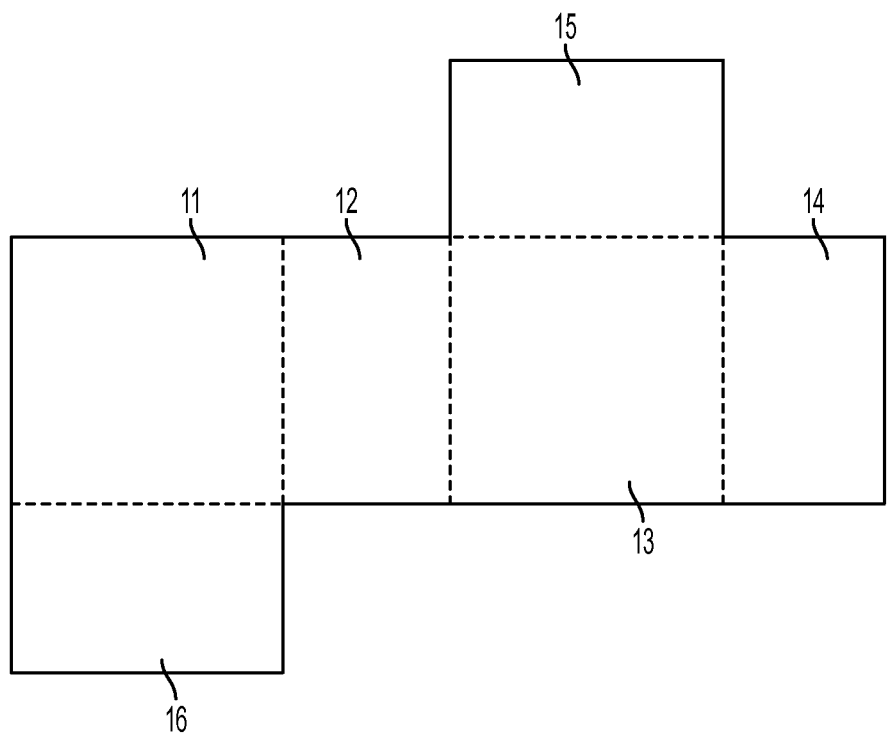
FIG. 1 depicts an example of a package flat.

FIG. 1 shows a common package flat, in this case a rectangular box, with a variety of facets 11-16 as they may be commonly envisioned by a human. Facet 15 may be a lid that can be opened when the flat is folded into a three-dimensional structure, while facet 16 may be a floor or base that generally remains closed and locked in place when the flat is folded into a three dimensional structure.

To define the package, a system may generate a user interface that allows a user to enter dimensional and functional information. The system may then use that information to create a package definition file, containing instructions for cut lines and fold lines that package generation equipment may use to construct the package flat. In the example of FIG. 1, the user may have entered dimensional information such as height, width and depth. The user also may have provided functional requirements such as a lid and locking floor. The system may use this information to define the facets, and functional elements. Note that in the example of FIG. 1, the location of the lid and floor may vary, as the lid facet 15 could be attached to any side facet, as could the floor facet 16, without altering the resulting three-dimensional structure.

Functional elements are facets that have a functional property for the three dimensional structure, and may or may not be visible in the closed package. In general, functional elements may connect package faces, influence the assembly of the package and/or change a structural property of the assembled package as compared to the package flat. Examples of such properties include rigidity and dust protection. This document will generally use the term "tab" when referring to a functional element that connects with another element in a secure manner, such as with a tab-and-hole arrangement. It will generally use "flap" when referring to a functional element that covers a seam in a manner that allows it to easily be opened, and thus it may not substantially contribute to stability.

Figure 2:
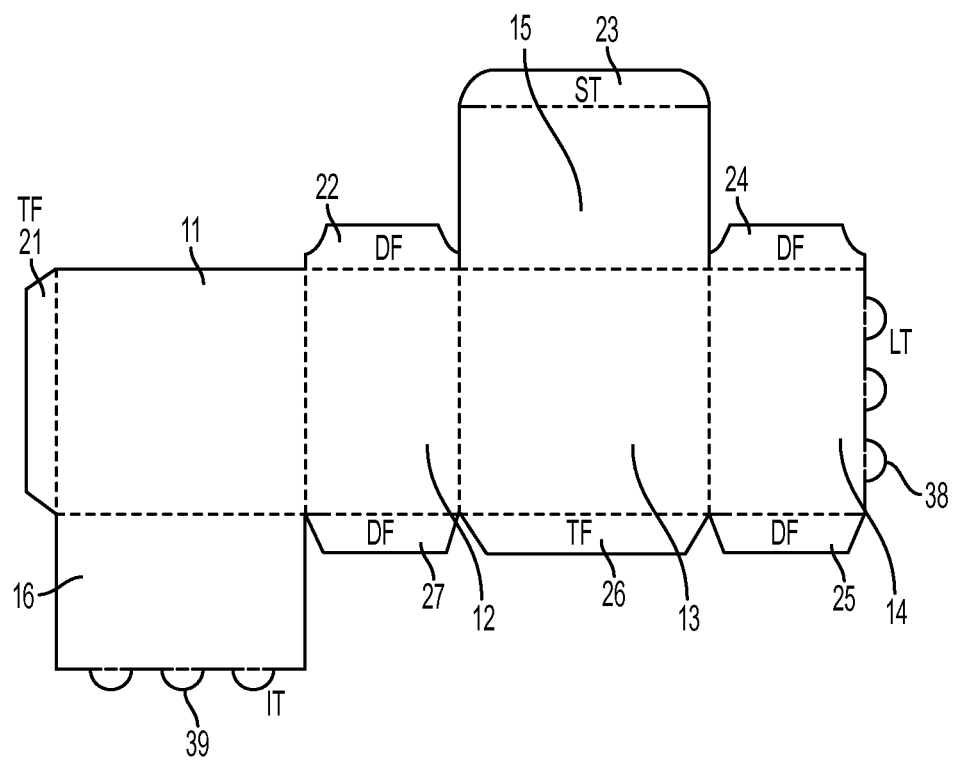
FIG. 2 depicts an example of a package flat with functional elements, all of which are symmetric with respect to their corresponding functional elements.

FIG. 2 shows the same three dimensional geometric shape of FIG. 1 mapped to a workable flat with faces 11 through 16 and functional elements 21-27 and 38-39 representing connecting elements. In this illustration, the functional elements labeled DF 22, 24, 25 and 27 may be considered to be flaps, functional element ST 23 may be considered to be a sliding tab, functional elements FL 38 and 39 may be considered to be locking tab structures, each of which includes one or more locking tabs. In this document, the terms are intended to be descriptive, but it is understood descriptions are not to be limiting definitions. For example, a sliding tab might be considered a flap. Functional elements TF 21 and 26 may be considered to be tab flaps, each of which includes a receiving slot structure comprised of a flap with one or more openings sized and positioned to receive the locking tabs when the flat is folded into a three dimensional structure. The dotted lines in FIG. 2 represent fold edges to which the package generation system may apply a crease or score in order to create an angle when the substrate is folded. The solid lines represent cut lines. When a package generation system produces the flat 10 from a substrate, it will cut the substrate along the cut lines and score, partially cut or impress the substrate along the fold lines. The substrate also may include printed content such as letters, numbers, graphics, barcodes, or other material that is printed on the substrate. Some or all of the printed content may be printed on the substrate before the substrate enters the package production device.

In FIG. 2, the tabs are symmetrically located with respect to their relevant fold edges. In other words, using an example the tabs of locking tab structure LT 39 are symmetrically located (i.e., identical spacing along the edge) with respect to the openings on tab flap 26. Symmetrical relationships also apply between the tabs of locking tab structure LT 38 and the receiving slot structure of tab flap TF 21, as well as sliding tab ST 23 and the cut edge of facet 11. However, this may not be the case for all structures. For example, if the package where intended to be a closed cube, or if it were a 3-sided column or 5-sided column, then a symmetrical relationship for all tabs/flaps could result in binding or imprecise matching when the flat is folded into a three-dimensional structure.

Figure 3:
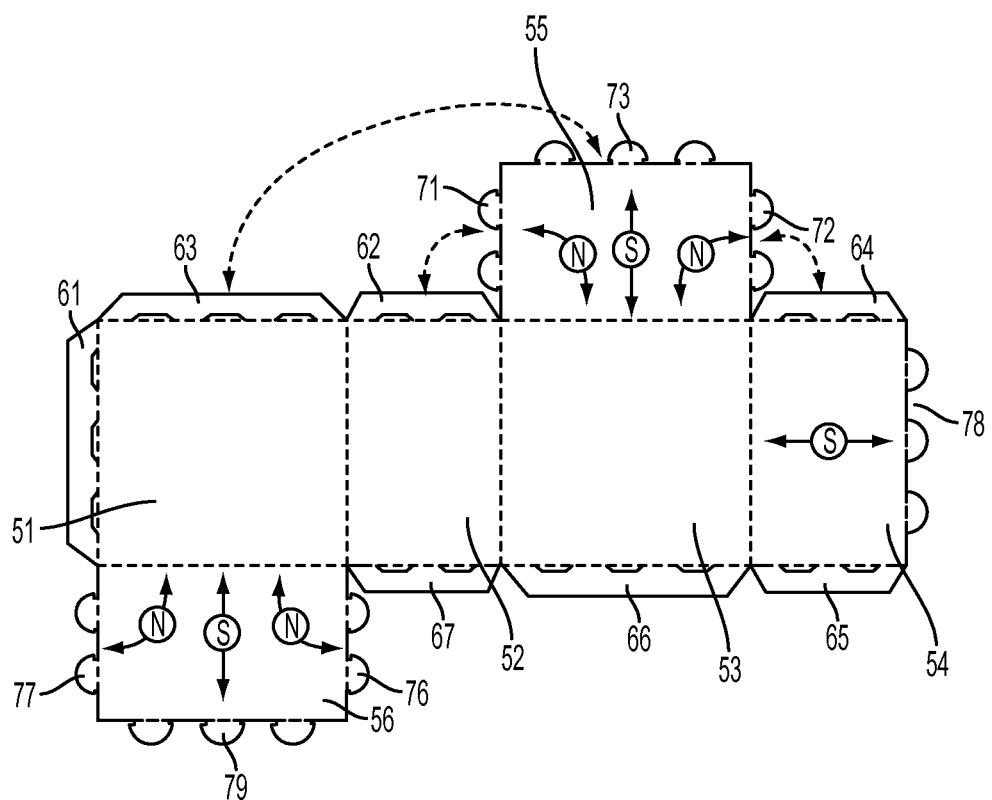
FIG. 3 depicts an example of a package flat with functional elements, all of which are symmetric with respect to their corresponding functional elements.

For example, FIG. 3 shows an embodiment of a package having no lid but instead a top 55 that locks into the sides 51-54, as does the bottom 56. Instead of a sliding tab, the top facet 55 includes a locking tab structure 73 containing tabs that are symmetrically located with respect to the openings on tab flap 63. Locking tabs 79 are also still symmetrically located with respect to the openings on tab flap 66, as are the tabs of tab structure 78 and the openings on tab flap 61. The tabs themselves also exhibit a symmetric shape, in that they contain the same features and dimensions along either side of a center line. Note that in the package flat, each of these sets of tabs (73, 78 and 79) is parallel to the fold edge of the facet to which the tabs are connected. (This relationship is illustrated by an "S" with arrows in FIG. 3.) Thus, these tabs can be positioned to be symmetric with respect to their receiving slots on a corresponding tab flap. However, to lock the top 55 and bottom 56 in place, additional locking tabs are included along additional sides of those facets. In particular, top facet 55 includes side locking tab structures 71 and 72 that are positioned to be received by receiving slots in tab flap 62 and 64. Bottom facet includes side locking tab structures 76 and 77 that are positioned to be received by receiving slots in tab flaps 65 and 67.

If these additional locking tabs structures were symmetric with respect to their corresponding tab flap slots, they would bind or not precisely meet the slots when the structure is folded because they are received from an angle and not in a direct line. These additional, non-symmetric locking tabs are not parallel to the fold edge of the facet to which the tabs are connected. (This relationship is illustrated by an "N" with arrows in FIG. 3.) Thus, in the embodiments of this disclosure, the system may modify the size and/or shape of these additional locking tabs to be non-symmetric so that they can be received by the slots in an oblique manner, rather than a straight manner. When the structure is folded, the edge to which the non-symmetric tabs are attached will include a pivot point at which the edge is attached to an edge of one or more adjacent facets.

Figure 4A:
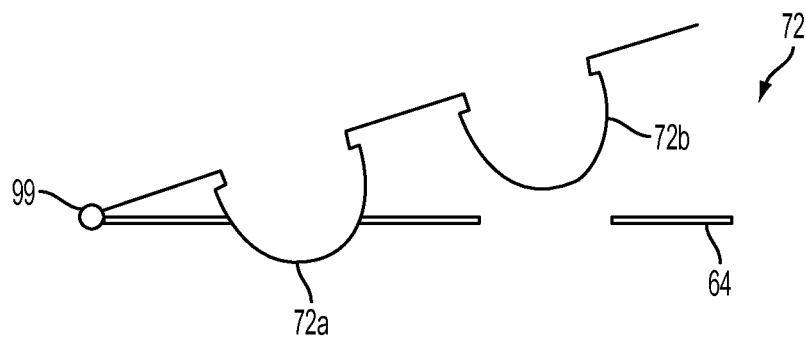
FIGS. 4A-4C illustrate how a symmetric set of tabs and slots may interlock with each other.
Figure 4B:
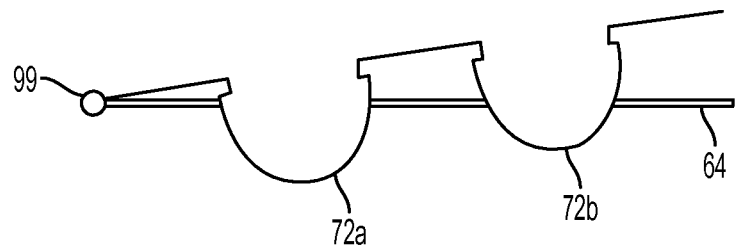
Figure 4C:
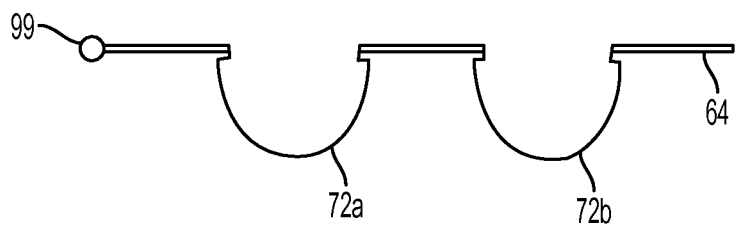

An example of how a set of symmetric tabs may be received by the receiving slot structure of an adjacent flap is shown in the sequence of FIGS. 4A-4C. In this sequence, an edge containing locking tabs 72a and 72b pivots about a pivot point 99 so that the tabs are received by slots of the receiving slot structure. As the tabs move toward the slots, the symmetric tabs and slots connect in a non-symmetric manner, so that the tab 72a nearest the pivot point 99 reaches its corresponding receiving slot before the tab 72b that is further from the pivot point 99 reaches its corresponding receiving slot. This non-symmetry in the dynamic process of connecting can cause problems when the package flat is assembled into a three-dimensional structure.

To address this issue, in the embodiments of this document the package definition system will adjust its parameters to account for the non-symmetry. The system provides a user interface that allows a user to define dimensions and properties for a package, and it creates a package definition file based on those dimensions and properties. As the user alters dimensions and/or properties, the system will dynamically change the package definition at any stage in the design process, yielding very different geometries, but maintaining the underlying functional properties. The system does this by a functional element description that allows the independent treatment of facets and functional elements of the three dimensional structure. The developed functional element-based representation allows for a variety of package sizes and styles without the need for a large template library. The representation can be used to produce cut and fold commands for a knife-plotter based system, a die production system, or another package generation system.

Figure 5:
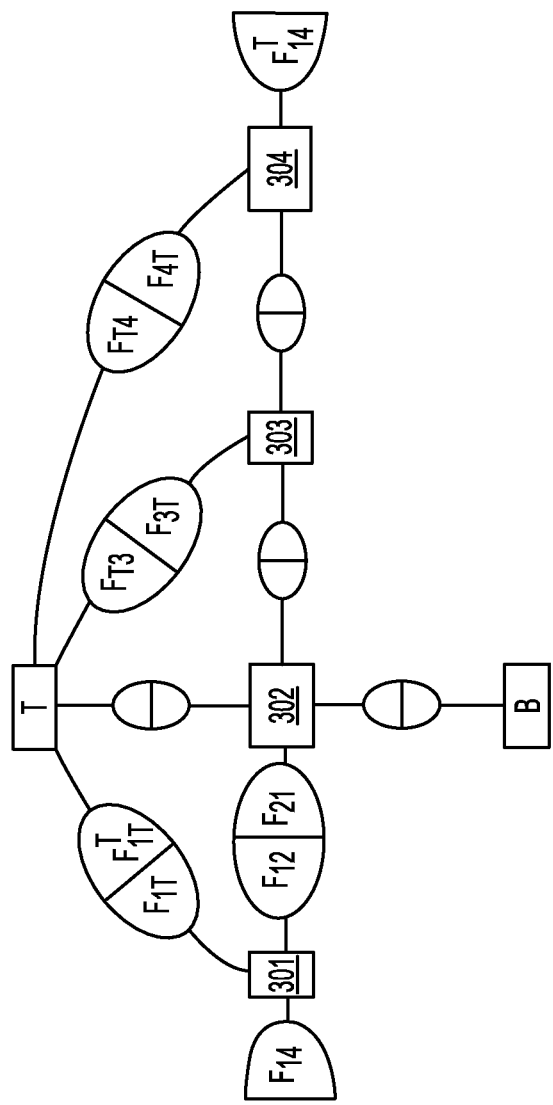
FIG. 5 illustrates an example of a graph representation of a package design for a package definition file.

FIG. 5 illustrates a preliminary stage of a graph representation of a package as a set of links and nodes. Nodes represent the shape elements or sides (B representing the bottom facet, T representing the top facet, and 301-304 representing the side facets) or functional elements ($F_{14}$, $F_{14}^T$, etc.). Links represent connections between faces and/or functional elements, such as functional element links $F_{14}|F_{14}^T$, $F_{17}|F_{17}^T$, etc. Some functional elements may be explicit active elements of the graph, allowing functional element links to dynamically transform into optional nodes, into NULL elements, and to modify other elements, including shape elements as sides, as is the case for $F_{1T,14}|F_{14,1T}$ correspond to the elements that join facets 11 and 14 in FIG. 2. Note that for simplicity, not all functional element links connecting all facets are shown. In addition, not all nodes have yet been defined in FIG. 5. For example, the nodes between faces 302 and 303 may be functional elements, folds, or something else.

Functional elements here and in the following discussion might again be a group of other functional elements, where the notation $F_{X,Y}$ normally indicates a complete functional element and a direct label. When stored in a data file, a node may contain dimension information, tag information that pertains to the function of the facet, and printable information such as associated text and/or image and print orientation. Links describe the interconnected relationship between related functional element pairs. A link may contain general description information, such as a "fold." In addition or alternatively, the link may include more specific information about how a package generation device should create an edge to allow the connecting relationship, such as by applying a crease, a "kiss cut" or any other method. A link may include structural information in the form of a functional element link that will later be resolved into additional nodes and links until all remaining links are of a simple fold or dimension form.

With a graph representation that incorporates nodes and functional element links (which this document may refer to as a functional element representation), a processor may create a rule set that includes instructions for applying cut and fold lines to define the functional elements and other elements of the package. The rule set may include instructions to alter the number and size/shape of functional elements or their components, to bind functional elements that are disjointed in a two-dimensional flat but joined in a three-dimensional space, and to create an outline cut. An example of an outline cut is shown by the outermost (solid) lines in the package flat of FIG. 2. To produce the outline cut, the processor may first resolve all functional element links that map into nodes in the given the final package structure and dimensions, "walk" the graph representation by starting on any facet and selecting an edge that does not have a fold-connecting relationship to another facet. The system produces a cut command for that edge, and then follows adjacent edges in a clockwise direction, counter-clockwise direction, or another determined order for a sequence of adjacent non-fold edges, producing cut commands for them and continuing until it reaches an edge that has fold-connecting relationship with another facet. When that happens, the system steps in to that facet and looks to the counter-clockwise adjacent edge, and proceeds as it did for the previous facet, producing cut commands for sequences of non-fold edges and stepping through to the connected facet for fold edges. This continues until it returns to the starting point. In that manner the system defines the cut commands for the outline of the box in a counter-clockwise order while stepping in an organized way through the graph. It should be noted that the invention is not limited to operation in a counter-clockwise direction, as it may move in a clockwise direction as well.

To generate fold line instructions and other cut line instructions, the system may analyze each facet. In addition or alternatively, it may analyze each edge that is not part of the outline cut. Facets that have fold-connecting edges may receive fold line commands with kiss cuts, fold knife or other fold options selected. Edges that are not fold-connecting may receive cut line commands. Other methods of generating cut line and fold line instructions may be used.

Figure 6:
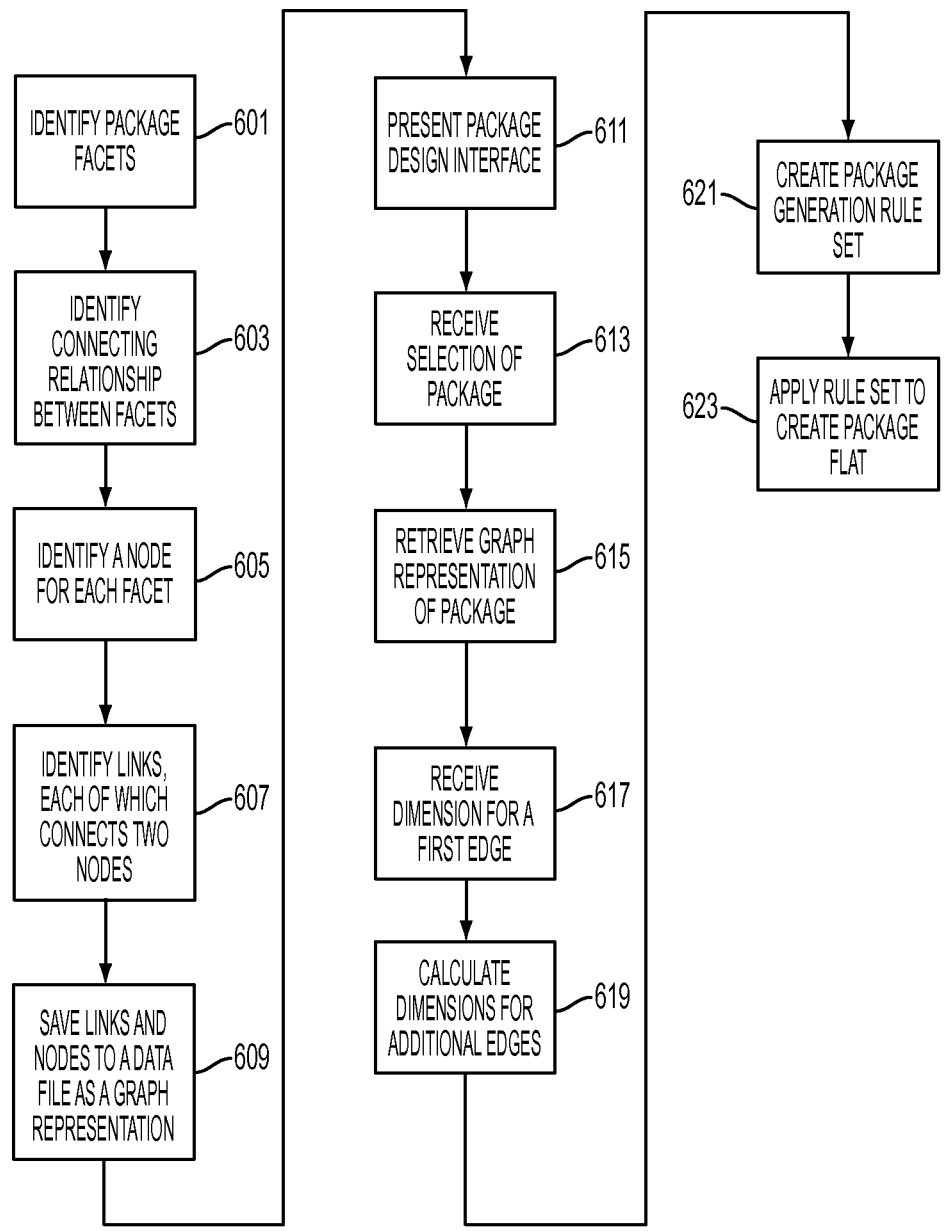
FIG. 6 is a flowchart showing an example of a package definition process.

FIG. 6 illustrates steps that a package definition system may follow when creating a graph representation of a three-dimensional package. The system may identify a set of facets for the package 601. Initially, each facet will be a face which will include a set of edges. For each edge, the system may identify a connecting relationship between the edge's facet and a different one of the faces 603. The system will then create a graph representation of the three dimensional package made up of links and nodes and introduce the functional element nodes that may or may not be mapped to facets, dependent on the functional layout of the package. In the initial stage, the dynamic graph will thus contain the nodes representing the facets of the package that are described as faces, plus a set of functional elements which might in a later stage be mapped to additional nodes connected by additional functional element links. The system will assign each node to a facet so that it represents the facet 605. The system will assign a link to each pair of nodes that have a connecting relationship between two of their edges 607. The system may then save the graph representation to a memory as a data file 609.

When a user seeks to design a package, the system may present a package design user interface to the user 611. The user may use the user interface to select a package 613 such as by specifying its template or generic structure. The system will populate the graph representation with the nodes and links relevant to the desired structure and optionally display to the user a resolved graph with default sizes for the face elements of the desired structure that corresponds to the structure 615. The user will specify one or more dimensions 617, which may be newly-developed or predefined. The system will use the graph representation to determine dimensions for the other connected elements 619, be they direct, fold-linked, edges between shape elements or functional elements or be they "dimension relationship-linked" edges. Links that are dimension links are edges that, though not adjacent in the two dimensional flat, are adjacent, or otherwise related in a dimensional way in the three-dimensional folded version of the package. For example, to start the dimension development process the system may identify a linked edge that has a connecting relationship with the user-specified edge, and determining a dimension for the linked edge based on the user-selected dimension for the user-specified edge. From that linked edge, the user dimension may be propagated further to other edges in the graph via links in the graph and by geometric symmetry within facets. By seeding user-specified dimensions into the graph and then propagating the dimensions across links, the actual dimensions of all facet edges can be obtained.

In another step, the system will determine the specific structure of the functional elements based on the desired structure and based on the subsequently input size information from the links. This is done by visiting all links and resolving all links that are not simple "fold" or "dimension" links into their appropriate number of nodes and links based on the structural information and dimensional information. The system will then create a package generation rule set that includes the dimensions and structural parameters for each of the facets 621.

The rule set may include, for example, a set of cutting and/or scoring instructions that a package generating device may use to apply cut lines and/or fold lines to a substrate. The instructions may be saved to a computer readable memory such as a package generation file. The system may do this by retrieving a group of instructions for the edges of each facet from an instruction database, modifying groups as necessary based on each facet's relative position in the package, and then combining each retrieved group into an overall instruction set for the package flat. The instructions may include a series of instructions to either (a) apply a cut or fold line to the substrate, or (b) move the tool to a new position on the substrate without altering the substrate. The system may then use a package generation device to apply the package generation rule set by imparting cut lines and fold lines to a substrate to yield a package flat 623.

Figure 7:
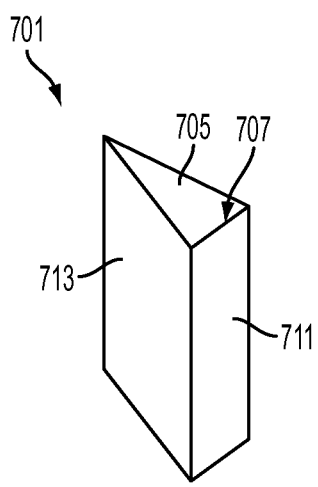
FIG. 7 shows an example of a three-dimensional package that may be produced from a package flat.

For example, FIG. 7 illustrates an example of a three-dimensional package 701 for which the system may generate a production rule set. The production template for the package may include a rule set including cut instructions, fold instructions, and structural parameters such as shape and dimension information for the facets. For example, the rule set may indicate that the package's structural features will include a first face 711 having an edge 707 that is adjacent to and interconnected with a lid 705. The structural parameters may indicate that the lid 705 has a triangular shape. The structural parameters also may indicate that the first face 711 is rectangular with a height corresponding to an overall height (for example, a default of 10 cm) and a width corresponding to the width of the base of the triangular lid 705.

The processor may then determine, based on rules contained in the template, that the remaining structural features require two more facets 713 that are each adjacent to the first facet 711 along its 10-cm edge and adjacent to the lid 705 along the lid's two sides. The height of each side facet 713 would equal the total height (e.g., default of 10 cm), and the width of each side facet 713 would equal that of the adjacent lid.

In the example of FIG. 7, the lid 705 may be a facet having locking tabs extending from two edges of the face, while a third edge of the face may be connected to one of the side facets (such as side 711) along a fold line 707. A flap containing receiving slots may extend upward from the other side facets (e.g., side 713). If so, then when the lid is folded along the fold lines, the lid may pivot about the edge so that the tabs are received by the receiving slots in a non-symmetric manner.

Because the number, location and size of the tabs are not pre-defined, but are instead variable until the system saves and implements the final design file, the system will implement a dynamic process to determine the number and location of non-symmetric tabs. This may be done defining the tabs as a symmetric functional element, identifying a pivot point along an edge of the facet to which the tabs are attached, converting the symmetric functional element, and using to a non-symmetric functional element using a geometric transformation that relies on the pivot point. FIGS. 8-11 illustrate example methods by which this may be accomplished.

Figure 8A:
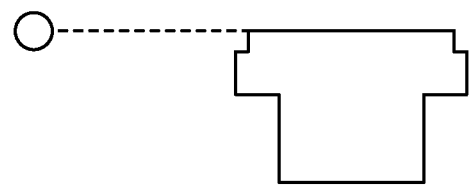
FIGS. 8A-8C illustrates a first method of converting a symmetric representation of a functional element to a non-symmetric representation of the functional element.
Figure 8B:
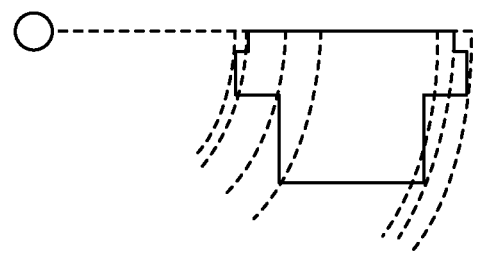
Figure 8C:
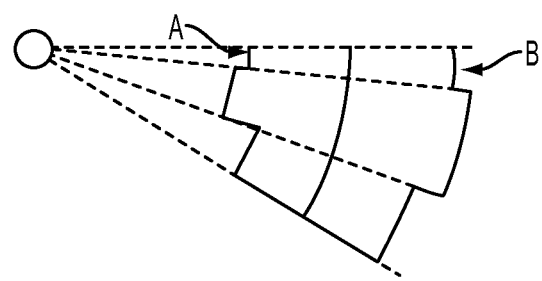

For example, referring to FIGS. 8A-8C, the system converts a Cartesian (x, y) coordinate tab description into a polar coordinate system, uses the horizontal axis (x) as the simple radial polar coordinate (r). The system uses the vertical axis (y) to define the angle (α). For simplicity of description, FIG. 8A shows a conceptual tab of low complexity, essentially replacing the curved lines on a normal tab with a few straight lines for clarity. FIG. 8B indicates that some of the straight lines that replaced the curved lines may be modified to exhibit a constant distance (r) from the pivot point, which is represented by the large black dot in the figure. FIG. 8C illustrates that the straight edges of the tab may be mapped to the radial curves identified in the step of FIG. 8B. Thus, when this tab is pivoted about the pivot point and received into a slot, the tab will curve into the slot along Side A, while Side B will follow along with side A as the tab continues into the slot. The tab will now be received into the slot in an even manner, with interlocking properties because of the wider portion of the tab. Note that in this embodiment, the angle having a vertex at the pivot point results in the top and bottom edges of the tab's representation not being parallel to each other, but instead being positioned to form the lines that intersect at the vertex. In this embodiment, the wider portion of the tab may have a gap on one side or the other of the slot. If Side A is appropriately sized, Side B may be too large. If Side B is appropriately sized, Side A may be too small. Thus, the approach of FIGS. 8A-8C is only one option, and others may also be used as described below.

Figure 9:
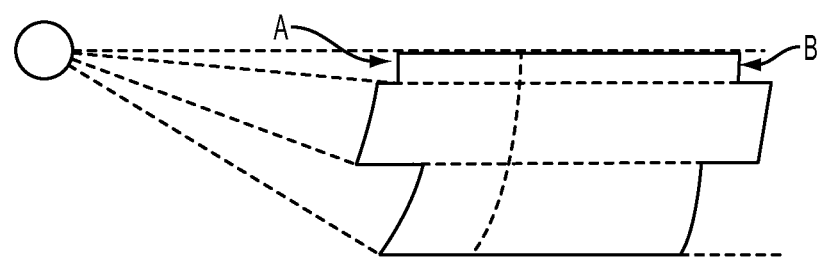
FIG. 9 illustrates a second method of converting a symmetric representation of a functional element to a non-symmetric representation of the functional element.

In an alternate embodiment, FIG. 9 illustrates that the system may convert the tab's Cartesian (x, y) coordinate tab description into a polar coordinate system by maintaining the y-axis (i.e., height, which may be measured as the distance from the distal edge of the tab to the edge of the facet to which the tab is connected) and only converting a radial component. Here, the top and bottom edges of the tab remain parallel to each other. This tab will exhibit a tighter fit than that of FIG. 8C, but not all parts will be received into the slot in a symmetric manner.

Figure 10:
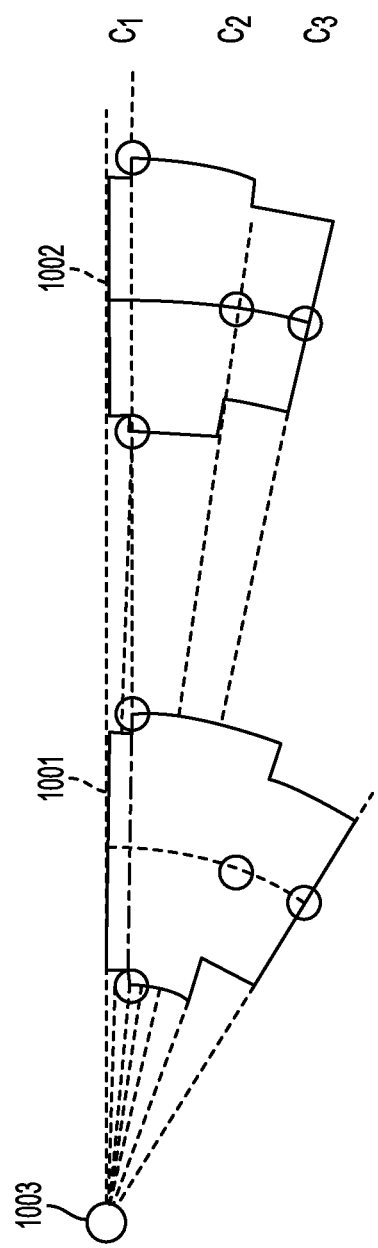
FIG. 10 illustrates a third method of converting a symmetric representation of a functional element to a non-symmetric representation of the functional element.

FIG. 10 illustrates a hybrid of the methods of FIGS. 8 and 9, in which the system converts the tabs from a Cartesian coordinate representation to a polar coordinate representation by identifying one or more critical points of the tab. This document uses the term "critical point" to refer to a location on a tab that will maintain its height (i.e., y-axis position, or distance from the edge of the facet to which the edge is connected), while other portions of the tab may be moved, as the tab is transformed from a Cartesian representation to a polar coordinate representation. In FIG. 10, each tab includes a wider portion that serves to interlock the tab within its receiving slot, and it defines critical points as (1) the two topmost corners of the wider portion $C_1$, (2) the center of the bottom edge of the wider portion $C_2$, and (3) the center of the bottom edge of the tab $C_3$. The system may include critical point definitions (i.e., rules for locating critical points) in its definition of the particular type of tab used, and it may apply those definitions to automatically identify the critical points before making the transformation. As shown in FIG. 10, two tabs 1001 and 1002 may be positioned along an edge of a facet that will be connected to another facet via a pivot point 1003. Because the two tabs 1001 and 1002 have different distances from the pivot point 1003, the transformed tabs 1001 and 1002 will no longer be identical, and the precise dimensions and shape for each tab will be dynamically determined based on the tab's position with respect to the pivot point. However, the critical points $C_1$, $C_2$, and $C_3$ on all such tabs may all be maintained at a constant distance from the edge of the facet to which the tabs are connected.

Figure 11:
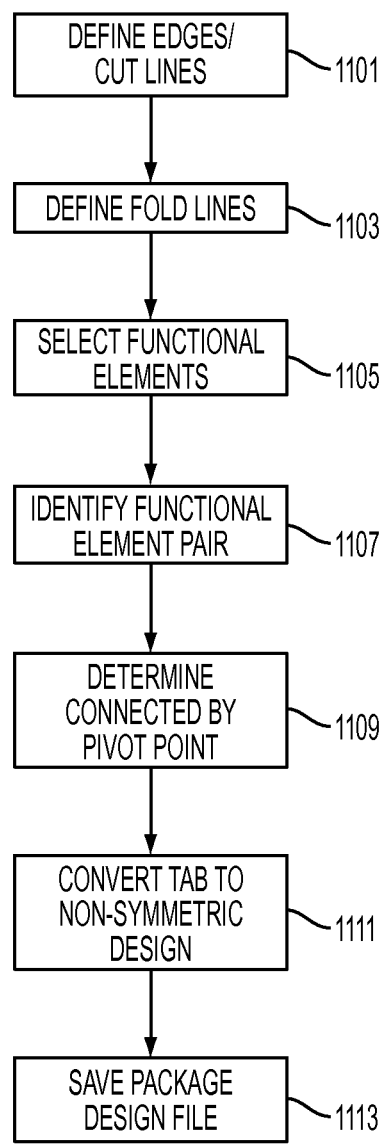
FIG. 11 is a flowchart depicting steps of a process of converting a symmetric functional element to a non-symmetric functional element.

FIG. 11 is a flowchart illustrating a process by which a system may convert a representation of a package having at least one symmetric tab to a representation where the tab has a non-symmetric design. In FIG. 11, the system may define a set of edges for the three-dimensional package structure (step 1101) using methods such as those described above. Each edge will represent a cut line, which is a line along which the three-dimensional structure will be separated from the two dimensional substrate after cut lines are applied to the substrate. The system also may define a set of fold lines (step 1103). The system will determine and select functional elements of the structure, each functional element being one that will be used to connect one facet of the structure to another facet of the structure (step 1105). Some functional elements may have a connecting relationship, such as one where a first facet includes a locking tab structure having a symmetric design and the second facet of the pair includes a receiving slot structure, or one where a sliding tab is received along an interior portion of a facet at the facet's edge. When the system identifies such a connecting relationship (step 1107) and determines determining that the tab structure and receiving structure are connected to facet edges that are connected to each other via a pivot point (step 1109), it will convert a definition of the tab structure from the symmetric design to a non-symmetric design (step 1111). It will then save dimensions for the defined edges and functional element to a package design file so that the tab structure definition includes the non-symmetric design (step 1113).

Figure 12:
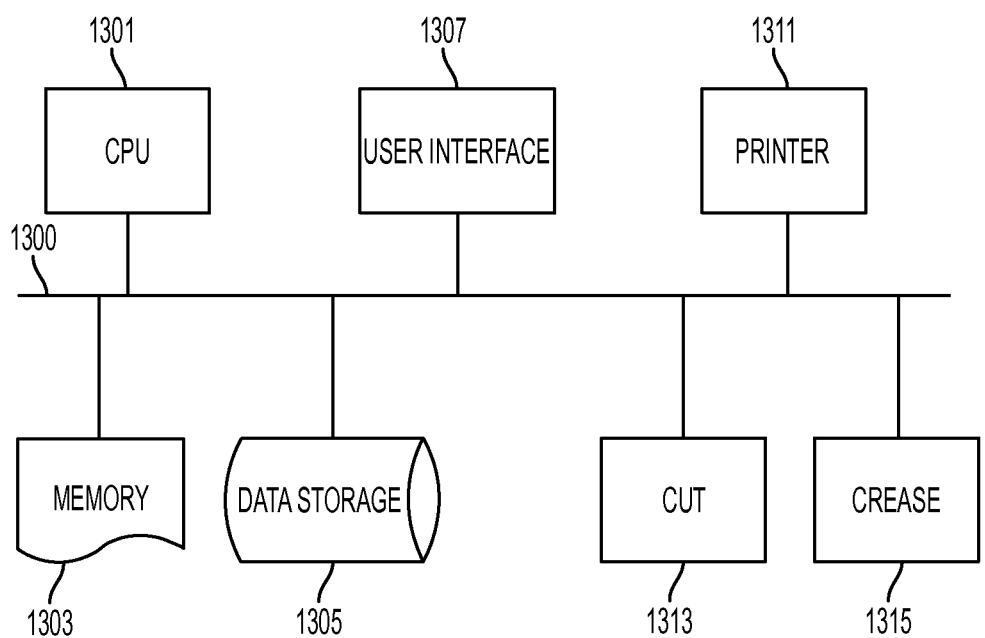
FIG. 12 is a block diagram showing various equipment that may be used to implement various embodiments of the processes described in this document.

FIG. 12 depicts a block diagram of hardware and/or electronics that may make up a package definition and/or production system. One or more communications lines 1300 such as a bus or network interconnect the illustrated components and allow data and/or signals to flow between the components. CPU 1301 represents one or more processor that performs calculations and logic operations required to execute a program. Any number of processors may be available, and they may be part of a single electronic device or distributed across any number of networked electronic devices. When this document and its claims uses the term "processor," then unless specifically stated otherwise it is intended to refer to all such embodiments (i.e., single processor or multiple processors). The processor(s) may access a computer-readable memory device 1303 containing programming instructions, along with a data storage facility 1305 such as a database that stores the package generation templates and/or rule sets.

A user interface 1307 is a device or system that provides output to, and receives input from, a user. The user interface may include a display, audio output, a printer, or another element that provides information to a user. The user interface 1307 also may include a touch-sensitive component, microphone, audio port, keyboard, mouse, touch pad, or other input mechanism that is capable of receiving user input.

The system also may include a package generation device, which may include some or all of the following elements: a printer 1311, a knife or other cutting device 1313, and a roller or other device 1315 capable of imparting a crease in a substrate.

The features and functions disclosed above, as well as alternatives, may be combined into many other different systems or applications. Various presently unforeseen or unanticipated alternatives, modifications, variations or improvements may be made by those skilled in the art, each of which is also intended to be encompassed by the disclosed embodiments.

The invention claimed is:

1. A package generation system, comprising:
a cutting device;
a processor;
a data storage facility containing a package design file comprising a two-dimensional representation of a three-dimensional structure having a plurality of facets, wherein the package design file comprises rules that:
define a plurality of cut lines, each cut line representing a line along which the three-dimensional structure will be separated from a two dimensional substrate;
identify a plurality of facets that are functional elements of the structure;
identify a pair of the functional elements that have a connecting relationship, wherein the first facet of the pair comprises a tab structure having a symmetric design and the second facet of the pair comprises a receiving structure, wherein the symmetric design comprises edges of the tab structure that are symmetric with respect to a central axis of the tab structure;
determine that the tab structure and receiving structure are each connected to cut lines that intersect each other at a pivot point;
convert a definition of the tab structure from the symmetric design to a non-symmetric design that includes edges of the tab structure that are not symmetric with respect to the central axis of the tab structure; and
save dimensions for the defined cut lines and the pair of functional elements to the package design file so that the definition of the tab structure includes the non-symmetric design; and
programming instructions that are configured to cause the processor and cutting device to access the package design file to apply a set of rules that apply the cut lines to the substrate.

2. The system of claim 1, wherein the instructions to convert the definition of the tab structure to the non-symmetric design comprise instructions to use a location of the pivot point to define at least a portion of the tab structure using polar coordinates with respect to the pivot point.

3. The system of claim 2, wherein the instructions to define at least a portion of the tab structure using polar coordinates with respect to the pivot point comprise instructions to replace at least one straight edge of the tab structure with a curved edge, the coordinates of which exhibit a constant distance from the pivot point.

4. The system of claim 2, wherein the instructions to define at least a portion of the tab structure using polar coordinates with respect to the pivot point comprise instructions to replace at least one straight edge of the tab structure with a curved edge while maintaining a constant distance between a distal edge of the tab structure and the edge of the facet to which the tab structure is connected.

5. The system of claim 2, wherein the instructions to define at least a portion of the tab structure using polar coordinates with respect to the pivot point comprise instructions to:
define a plurality of critical points of the tab structure; and
replace at least one straight edge of the tab structure with a curved edge, while maintaining a constant distance between each critical point and the edge of the facet to which the tab structure is connected.

6. The system of claim 2, wherein the instructions to define at least a portion of the tab structure using polar coordinates with respect to the pivot point comprise instructions to:
identify a first tab element of the tab structure that is positioned along an edge of the facet to which the tab structure is connected, the first tab element being positioned at a first distance from the pivot point;
identify a second tab element of the tab structure that is positioned along the edge at a second distance from the pivot point, wherein the first tab element and the second tab element have identical dimensions in the symmetric design, and wherein the first distance is greater than the second distance;
define a critical point on each of the first tab element and the second tab element; and
replace at least one straight edge of each of the first tab element and the second tab element with a curved edge, while maintaining a constant distance between each critical point and the edge of the facet to which the tab structure is connected.

7. The system of claim 1, wherein the instructions to identify the pair of functional elements that have a connecting relationship comprise instructions to identify a set of locking tabs as the tab structure and identifying a set of receiving slots as the receiving structure.

8. The system of claim 1, wherein the instructions to identify the pair of functional elements that have a connecting relationship comprise instructions to identify at least one sliding tab as the tab structure and identifying an interior of a facet as the receiving structure.

9. A package generation system, comprising:
a cutting device;
a processor;
a data storage facility containing a package design file comprising a two-dimensional representation of a three-dimensional structure having a plurality of facets, wherein the package design file comprises rules that:
define a plurality of cut lines, each cut line representing a line along which the three-dimensional structure will be separated from a two dimensional substrate;
identify a plurality of facets that are functional elements of the structure;
identify a pair of the functional elements that have a connecting relationship, wherein the first facet of the pair comprises a tab structure having a symmetric design and the second facet of the pair comprises a receiving structure, wherein the symmetric design comprises edges of the tab structure that are symmetric with respect to a central axis of the tab structure;
determine that the tab structure and receiving structure are each connected to cut lines that intersect each other at a pivot point;
convert a definition of the tab structure from the symmetric design to a non-symmetric design that includes edges of the tab structure that are not symmetric with respect to the central axis of the tab structure; and
cause the cutting device to apply the defined cut lines to the substrate so that tabs are applied to the substrate with the non-symmetric design at the first facet.

10. The system of claim 9, wherein the instructions to convert the definition of the tab structure to the non-symmetric design comprise instructions to use a location of the pivot point to define at least a portion of the tab structure using polar coordinates with respect to the pivot point.

11. The system of claim 10, wherein the instructions to define at least a portion of the tab structure using polar coordinates with respect to the pivot point comprise instructions to replace at least one straight edge of the tab structure with a curved edge, the coordinates of which exhibit a constant distance from the pivot point.

12. The system of claim 10, wherein the instructions to define at least a portion of the tab structure using polar coordinates with respect to the pivot point comprise instructions to replace at least one straight edge of the tab structure with a curved edge while maintaining a constant distance between a distal edge of the tab structure and the edge of the facet to which the tab structure is connected.

13. The system of claim 10, wherein the instructions to define at least a portion of the tab structure using polar coordinates with respect to the pivot point comprise instructions to:
define a plurality of critical points of the tab structure; and
replace at least one straight edge of the tab structure with a curved edge, while maintaining a constant distance between each critical point and the edge of the facet to which the tab structure is connected.

14. The system of claim 10, wherein the instructions to define at least a portion of the tab structure using polar coordinates with respect to the pivot point comprise instructions to:
identify a first tab element of the tab structure that is positioned along an edge of the facet to which the tab structure is connected, the first tab element being positioned at a first distance from the pivot point;
identify a second tab element of the tab structure that is positioned along the edge at a second distance from the pivot point, wherein the first tab element and the second tab element have identical dimensions in the symmetric design, and wherein the first distance is greater than the second distance;
define a critical point on each of the first tab element and the second tab element; and
replace at least one straight edge of each of the first tab element and the second tab element with a curved edge, while maintaining a constant distance between each critical point and the edge of the facet to which the tab structure is connected.

15. The system of claim 9, wherein the instructions to identify the pair of functional elements that have a connecting relationship comprise instructions to identify a set of locking tabs as the tab structure and identifying a set of receiving slots as the receiving structure.

16. The system of claim 9, wherein the instructions to identify the pair of functional elements that have a connecting relationship comprise instructions to identify at least one sliding tab as the tab structure and identifying an interior of a facet as the receiving structure.

* * * * *